US006809155B2

(12) United States Patent
Musa

(10) Patent No.: US 6,809,155 B2
(45) Date of Patent: Oct. 26, 2004

(54) UNSATURATED COMPOUNDS CONTAINING SILANE, ELECTRON DONOR AND ELECTRON ACCEPTOR FUNCTIONALITY

(75) Inventor: Osama M. Musa, Hillsborough, NJ (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 0 days.

(21) Appl. No.: 10/302,574

(22) Filed: Nov. 20, 2002

(65) Prior Publication Data

US 2004/0097651 A1 May 20, 2004

(51) Int. Cl.$^7$ .................................................. C08F 8/00
(52) U.S. Cl. .................. 525/326.5; 525/474; 524/588; 528/25
(58) Field of Search ............................ 525/474, 326.5; 524/588; 528/25

(56) References Cited

U.S. PATENT DOCUMENTS

| | | | |
|---|---|---|---|
| 4,972,008 A | 11/1990 | Lee et al. ................... 523/203 |
| 5,300,569 A | 4/1994 | Drake et al. ................. 525/78 |
| 5,530,064 A | 6/1996 | Ashton et al. .............. 525/102 |
| 5,578,673 A | 11/1996 | Ashton et al. .............. 524/517 |

FOREIGN PATENT DOCUMENTS

| | | | |
|---|---|---|---|
| JP | 0159583 | | 7/1985 |
| JP | 361089242 A | | 5/1986 |
| JP | 64-20213 | * | 1/1989 |
| JP | 402132104 A | | 5/1990 |

OTHER PUBLICATIONS

"Poly BD® and 605 Resins Internally Epoxidized Polybutadienes", Technical Information, Elf Atochem North America Inc. and Sartomer Company, 5 pages.
Barrero, Alejandro F. et al., "Synthesis of (±)–Ambrox from (E)–Neroildol and β–Ionone via Allylic Alcohol [2,3] Sigmatropic Rearrangement", J. Org. Chem. 1996, 61, 2215–2218.
Boutevin, Gilles et al., "Synthesis and use of Hydroxyl Telechelic Polybutadienes Grafted by 2–Mercapto–ethanol for Polyurethane Resins", J. of Applied Polymer Science, vol. 75, 1655–1666 (2000).

Büchi, George et al., "Conversion of Allylic Alcohols to Homologous Amides by N,N–Dimethylformamide Acetals", J. of the American Chem. Society, 96:17, Aug. 21, 1974, pp. 5563–5565.
Flock, Solveig et al., "Syntheses of Three Metabolites of Icosapentaenoic and Docosahexaenoic Acids", J. Chem. Soc., Perkin Trans. 1, 2000, 3071–3076.
Kocienski, Philip et al., "A Highly Stereoselective and Interative Approach to Isoprenold Chains: Synthesis of Homogeraniol, Homofarnesol, and Homogeranylgeraniol", J. Org. Chem. 1989, 54, 1215–1217.
Nakamura, Shingo et al., "Enantloselective Biomimetic Cyclization of Isoprenoids Using Lewis Acid–Assisted Chiral Brønsted Acids: Abnormal Claisen Rearrangements and Successive Cyclizations", J. Am. Chem. Soc. 2000, 122, 8131–8140.
Schapman, F., et al., "Low Molar Mass Polybutadiene Made Crosslinkable by Silance Moities Introduced Via Addition of Thiol to Double Bond: 3.Synthesis and Kinetic Study", Polymer, vol. 39, No. 20, pp. 4955–4962, 1998.
Malik, R., et al., "Epoxy Graft Functionalization of Poly(Butadiene)", J.M.S.–Pure Appl. Chem., A34(2), pp. 247–263 (1997).

* cited by examiner

Primary Examiner—Kuo-Liang Peng
(74) Attorney, Agent, or Firm—Jane E. Gennaro

(57) ABSTRACT

This invention relates to curable compounds or resins containing electron donor or acceptor functionality, carbon to carbon unsaturation, and silane functionality, having the structure:

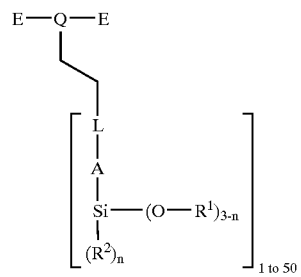

in which E is an electron donor or electron acceptor functionality; Q is an oligomeric or polymeric group containing at least one carbon to carbon double bond, A is a hydrocarbyl group; and L is a linking group.

4 Claims, No Drawings

UNSATURATED COMPOUNDS CONTAINING SILANE, ELECTRON DONOR AND ELECTRON ACCEPTOR FUNCTIONALITY

FIELD OF THE INVENTION

This invention relates to compounds and resins containing at least one double bond, electron donor or electron acceptor functionality, and silane functionality for use in semiconductor packages.

BACKGROUND OF THE INVENTION

Adhesive compositions are used in many industries, such as the microelectronics industry, where good adhesion to metal and organic substrates and low viscosity for easy dispensability are important requisites.

Adhesion to metal and organic substrates is not always easily achievable, and the addition of silane adhesion promoters to adhesive formulations is one means of correcting this deficiency. Commonly used and commercially available silanes are small molecules that tend to volatilize significantly before the cure temperature of the adhesive is reached. Because silanes tend to be subject to hydrolysis, the addition of higher amounts of the silanes to offset the volatility could lead in turn to the presence of moisture in the adhesive compositions. This could be a problem in many applications. With reference to microelectronic devices, moisture creates the potential, through corrosion of circuits or voiding of the moisture and delamination of device packaging, for eventual failure of the device.

As a solution to these problems this specification discloses adhesion promoting resins with sufficient molecular weight to give lower volatility than the silanes currently commercially available.

SUMMARY OF THE INVENTION

This invention is a curable compound or resin or both (hereinafter, "compound" or "resin" shall mean "compound or resin or both") that contains an oligomeric or polymeric segment, a silane segment, and electron donor or electron acceptor functionality. In one embodiment, the resin is formulated into a die attach adhesive, which further contains a conductive or nonconductive filler, and optionally, an initiator.

DETAILED DESCRIPTION OF THE INVENTION

The oligomeric or polymeric segment of the resin will contain at least one carbon to carbon double bond, and can be provided by a precursor resin or compound that is commercially available. Alternatively, the precursor resin or compound can be synthesized by the practitioner.

Suitable oligomeric segment precursors are linear or branched hydrocarbons having 1 to 50 carbon atoms, which contain a reactive functionality for ultimate reaction with a co-reactive functionality on the silane segment precursor. Exemplary precursors include N-methylallylamine, N-ethyl-2-methylallyl-amine, diallylamine, N,N'-diethyl-2-butene-1,4-diamine, N-allylcyclopentyl-amine, allylcyclohexyl-amine, 2-(1-cyclohexenyl)ethylamine.

Exemplary suitable polymeric segments are homopolymers of 1,3-butadiene, or copolymers of ethylene, propylene and a diene. Preferred are poly(butadienes), which are commercially available with hydroxyl-, amino-, halo-, epoxy-, and isocyanate-functionality.

The unsaturated oligomeric or polymeric segment may be any molecular weight and structure desired by the practitioner, provided it has at least one carbon to carbon double bond for subsequent cross-linking. The oligomeric or polymeric segment may contain heteroatoms, such as, silicon, sulfur, nitrogen, or oxygen; may contain functional groups, such as hydroxyl, urea, carbamate, or ester; may contain cyclic or aromatic moieties. The at least one carbon to carbon double bond can be located within the oligomeric or polymeric backbone or chain, or pendant from the chain.

The silane segment will have the structure

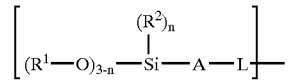

in which n is simultaneously for each position 0, 1, or 2; $R^1$ is a methyl or ethyl group; $R^2$ is a vinyl group, an aromatic group, or a linear or branched alkyl group, preferably of 1 to 4 carbon atoms, and more preferably methyl or ethyl; A is a linear or branched alkyl group or a cyclic or an aromatic group, and L is a linking group resulting from the reaction of a functional group on the silane precursor and a functional group on the oligomeric or polymeric precursor. There can be more than one silane segment per molecule of resin.

Examples of commercially available silanes suitable as precursors for the silane segment are gamma-isocyanato-propyltriethoxy-silane, gamma-aminopropyltriethoxy-silane, gamma-aminopropyltrimethoxy-silane, N-beta-(aminoethyl)-gamma-aminopropyltrimethoxysilane, triamino-functional silane, bis-(gamma-trimethoxysilyl-propyl)amine, N-phenyl-gamma-amino-propyltrimethoxy-silane, N-beta-(aminoethyl)-gamma-aminopropyl-methyldimethoxysilane, gamma-mercaptopropyl-trimethoxysilane. 3-amino-propyldimethylethoxysilane; 3-bromopropyltrimethoxysilane, 3-chloropropylmethyl-dimethoxysilane, 3-chloropropyltrimethoxysilane, dimethylmethoxy-chlorosilane, methyldimethoxysilane, and methyldiethoxysilane.

The resin is synthesized through a reaction between the precursor (also, hereinafter, starting material) for the unsaturated segment and the precursor for the silane segment. Although any appropriate synthetic route convenient to the practitioner may be used, suitable synthetic routes are through condensation or addition reactions between co-reactive functionalities on the precursors. Examples of these reactions are illustrated later in this specification.

In one embodiment, the silane segment will be located pendant from a polymeric chain, and the polymeric segment will contain electron donor or electron acceptor groups at its termini. In this embodiment, the adhesion promoting resin will have the structure:

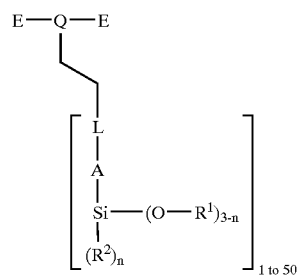

in which Q is an oligomeric or polymeric group containing at least one carbon to carbon double bond, derived from an oligomeric or polymeric precursor containing carbon to carbon unsaturation; n is simultaneously for each position 0, 1, or 2; $R^1$ is a methyl or ethyl group; $R^2$ is a vinyl group, an aromatic group, or a linear or branched alkyl group; A is a hydrocarbyl group, for example, a linear or branched alkyl group or a cyclic alkyl or alkenyl group, or an aromatic group; L is a linking group resulting from the reaction of a functional group on the precursor for the segment containing silane and a functional group on the precursor for the segment containing the at least one carbon to carbon double bond; and E is an electron acceptor or electron donor group.

Exemplary electron donor groups are vinyl ethers, compounds containing carbon to carbon double bonds attached to an aromatic ring and conjugated with the unsaturation in the aromatic ring, such as compounds derived from cinnamyl and styrenic starting compounds. Exemplary electron acceptor groups are fumarates, maleates, acrylates, and maleimides.

In another embodiment, the silane segment will be located at the termini of a polymeric chain, and an organic moiety containing an electron donor functionality, an electron acceptor functionality, or an epoxy functionality will be pendant from the polymeric chain. In this embodiment the adhesion promoting resin will have the structure:

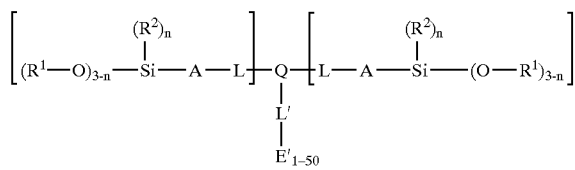

in which Q, A, L, $R^1$, and $R^2$ are as described before, L' is an organic moiety linking E' and Q; E' is an organic moiety containing an electron donor functionality or an electron acceptor functionality as described in paragraph of this specification, or an epoxy functionality; and L' is an organic moiety resulting from the reaction of a functional group on Q and a functional group on E'.

The functional groups on the oligomeric or polymeric precursors, on the silane precursors, or on the electron donor or electron acceptor precursors that will form the linking groups L and L' include hydroxyl, halide, amine, mercapto, isocyanate, epoxy, carboxylic acid, acid chloride, vinyl double bonds, and a hydrosilation reactive hydrogen on a silicon atom. One skilled in the art has the expertise to devise reactions with complementary functional groups to link the segments of the inventive compounds.

Within adhesive and encapsulant formulations, these resins will be used in an effective amount to cause adhesion promotion. In general, an adhesion promoting amount will range from 0.005 to 20.0 percent by weight of the total formulation. For some resins, particularly those in which an effective amount of cross-linking for the specific end-use can be achieved through the unsaturation in the polymeric or oligomeric chain, the amount used in the formulation will comprise the total or a major portion of resin used. In that case, the resin will be present in an amount up to 99% by weight.

In those formulations in which the resin is used in an effective amount to cause adhesion, the formulation may also contain at least one additional curable resin known for use as an adhesive, coating, encapsulant or sealant. Examples of such additional resins include epoxies, electron donor resins (for example, vinyl ethers, and resins that contain carbon to carbon double bonds attached to an aromatic ring and conjugated with the unsaturation in the aromatic ring, such as compounds derived from cinnamyl and styrenic starting compounds), and, electron acceptor resins (for example, fumarates, maleates, acrylates, and maleimides).

Preferably, the formulation will contain a curing agent, such as, a thermal initiator or photoinitiator, or both, present in an effective amount to cure the formulation. In general, those amounts will range from 0.5% to 30%, preferably 1% to 20%, by weight of the total organic material (that is, excluding any inorganic fillers) in the formulation. Preferred thermal initiators include peroxides, such as butyl peroctoates and dicumyl peroxide, and azo compounds, such as 2,2'-azobis(2-methyl-propanenitrile) and 2,2'-azobis(2-methyl-butanenitrile). A preferred series of photoinitiators is one sold under the trademark Irgacure by Ciba Specialty Chemicals. In some formulations, both thermal initiation and photoinitiation may be desirable: the curing process can be started either by irradiation, followed by heat, or can be started by heat, followed by irradiation. In general, the formulations will cure within a temperature range of 70° C. to 250° C., and curing will be effected within a range of ten seconds to three hours. The actual cure profile will vary with the components and can be determined without undue experimentation by the practitioner.

The formulations may also comprise conductive or nonconductive fillers. Suitable conductive fillers are carbon black, graphite, gold, silver, copper, copper alloys, platinum, palladium, nickel, aluminum, silver coated copper, silver alloys with platinum or palladium, bronze or brass alloys, silicon carbide, boron nitride, diamond, and alumina. Suitable nonconductive fillers are particles of vermiculite, mica, wollastonite, calcium carbonate, titania, sand, glass, fused silica, fumed silica, barium sulfate, and halogenated ethylene polymers, such as tetrafluoroethylene, trifluoroethylene, vinylidene fluoride, vinyl fluoride, vinylidene chloride, and vinyl chloride. If present, fillers generally will be in amounts of 20% to 90% by weight of the formulation.

In a further embodiment of this invention, the above described curable compounds are formulated into a die attach adhesive and used to adhere a semiconductor silicon chip to substrate, which assembly of chip and substrate is then encapsulated to give a semiconductor package. Various processes are known in the art for assembling and packaging an electronic device.

One such process comprises a first step of mechanically adhering the semiconductor chip to a central mounting pad in a metal lead frame with the electrically active surface of the chip exposed away from the mounting pad. A die attach adhesive, such as described earlier in this specification, is used for this purpose. The adhesive is applied to either the mounting pad or the passive face of the semiconductor chip, and the chip then contacted with heat and/or pressure to the mounting pad.

The leads of the lead frame are then bonded electrically to the contact pads located on the perimeter of the semiconductor chip by soldering fine gold wires to the contact pads and leads to effect an electrical interconnection. The chip and the lead frame are then encapsulated in a plastic package by an injection or transfer molding process, after which the electrical leads are trimmed to the desired length and formed to the desired configuration to provide a second level interconnect to a printed circuit board or other type of substrate.

In the following Synthetic Procedures and Examples, the reaction stoichiometry for the syntheses of starting materials and resins is given in molar equivalents per molecule of reactant. It will be understood by those skilled in the art that some of the reactants have more than one functionality per molecule, and that the ratio of molar equivalent per functionality can be varied to give a predetermined degree of reactivity or substitution. For convenience, the depicted structures show full substitution along the polymeric chain, but it should be understood that the level of substitution will depend in practice on the ratio of molar equivalents of functionality that are reacted.

For example, the level of hydroxyl functionality added to a poly(butadiene) through the reaction of mercaptoethanol with the pendant vinyl functionality on the precursor poly (butadiene) can be varied by the molar amounts of mercaptoethanol reacted, and can range from one molar equivalent to full substitution of the 20% of the pendant vinyl groups along the poly(butadiene) polymer chain. Similarly, the level of silane functionality added to an adhesion promoting resin can be varied by adjusting the mole equivalents of functionalities to be reacted.

Synthetic Procedures

PROCEDURE 1: Reaction of mercaptoethanol with pendant vinyl functionality on poly(butadiene) (PBD). The synthetic procedure is conducted according Boutevin, G., Ameduri, B., Boutevin, B., Joubert, J-P., *Journal of Applied Polymer Science*, 75, 1655–1666, 2000, in a ratio of 1:1 mole equivalent of mercapto functionality to vinyl functionality, at the level of substitution of desired.

PBD and 2-mercaptoethanol are degassed under nitrogen for ten minutes. When the temperature of the solution reaches 85° C., 1.6 mole equivalent of azobisisobutyronitrile (AIBN) per mole equivalent of mercaptoethanol is added, followed by a second similar addition after four hours. When the reaction time is eight hours, the residual mercaptoethanol is titrated and sufficient additional AIBN added to force the reaction to completion.

PROCEDURE 2. Reaction of isocyanate with alcohol. One mole equivalent of isocyanate is solvated in toluene in a three-necked flask equipped with a mechanical stirrer, addition funnel and nitrogen inlet/outlet. The reaction is placed under nitrogen, and a catalytic amount of dibutyltin dilaurate (catalyst) is added with stirring as the solution is heated to 60° C. The addition funnel is charged with one mole equivalent of alcohol dissolved in toluene. This solution is then added to the isocyanate solution over 10 minutes, and the resulting mixture is heated for an additional 3 hours at 60° C. After the reaction is allowed to cool to room temperature, the solvent is removed in vacuo to give the product.

PROCEDURE 3: Reaction of gamma-mercaptopropyltrimethoxysilane SM-E with pendant vinyl functionality on poly(butadiene). The synthetic procedure is conducted according to Schapman, F., Couvercelle, J. P., and Bunel, C., Polymer, 1998, Vol. 39, No. 20, in a ratio of 1:1 mole equivalent of gamma-mercaptopropyltrimethoxysilane to vinyl functionality, at the level of substitution desired. The level of silane functionality added can be varied by the molar amounts of mercaptosilane reacted and can range from one molar equivalent to full substitution of the 20% of the pendant vinyl groups along the poly(butadiene) polymer chain.

Poly(butadiene) and gamma-mercaptopropyltrimethoxysilane are degassed under nitrogen for ten minutes. When the temperature of the solution reaches 85° C., 1.6 mole equivalent AIBN is added, followed by a second similar addition after four hours. When the reaction time is eight hours, the residual mercaptosilane is titrated and sufficient AIBN added to force the reaction to completion. For illustration purposes only, full substitution of the pendant vinyl groups is shown in the structures in the Starting Materials and in the Examples.

PROCEDURE 4: Reaction of isocyanate with amine. One mole equivalent of isocyanate is solvated in toluene in a three-necked flask equipped with a mechanical stirrer, addition funnel and nitrogen inlet/outlet. The reaction is placed under nitrogen and the solution heated to 60° C. The addition funnel is charged with one mole equivalent of amine in toluene. This solution is added to the isocyanate solution over 10 minutes, and the resulting mixture heated for an additional 3 hours at 60° C. After the reaction is allowed to cool to room temperature, the solvent is removed in vacuo to give the product.

PROCEDURE 5: Reaction of alkyl halide with amine. One mole equivalent of alkyl halide is solvated in THF in a three neck flask equipped with a mechanical stirrer and addition funnel. The addition funnel is charged with one mole equivalent of amine in THF. This solution is added to the alkyl halide solution over 10 minutes at 0° C., and the resulting mixture is stirred for 12 hours at room temperature. The solvent is removed in vacuo and to the resulting mixture is added ether and water. The organic layer is extracted and dried over $MgSO_4$. The solvent removed in vacuo to give the product.

PROCEDURE 6: Reaction of alkyl halide with alcohol. One mole equivalent of alcohol, excess amount of 50% NaOH, a catalytic amount of tetrabutyl ammonium hydrogen sulfate, and one mole equivalent of alkyl halide in toluene are stirred for 5 hours at 53° C., then for 5 hours at 75° C. The reaction is allowed to cool to room temperature and the organic layer extracted and washed with brine three times. The isolated organic layer is then dried over $MgSO_4$, filtered and the solvent removed in vacuo to give the product.

PROCEDURE 7: Conversion of alcohol functionality to chloride functionality. The synthetic procedure is conducted according to E. W. Collington and A. I. Meyers, *J. Org. Chem.* 36, 3044 (1971). A stirred mixture of one mole equivalent of alcohol and 1.1 mole equivalent of s-collidine under nitrogen is treated with one mole equivalent of lithium chloride dissolved in a minimum amount of dry dimethylformamide. On cooling to 0° C., a suspension is formed which is treated dropwise with 1.1 mole equivalent of methanesulfonyl chloride. Stirring is continued at 0° C. for 1–1.5 hour, when the pale yellow reaction mixture is poured over ice-water. The aqueous layer is extracted with cold ether-pentane (1:1) and the combined extracts are washed successively with saturated copper nitrate solution. This is continued until no further intensification of the blue copper solution occurs, indicating complete removal of s-collidine. The organic extracts are dried ($Na_2SO_4$) and concentrated at room temperature, providing a residue of the product.

PROCEDURE 8: Reaction of alcohol with acid chloride. One mole equivalent of alcohol and triethylamine are mixed in dry methylene chloride at 0° C. One mole equivalent acid chloride dissolved in dry methylene chloride is carefully added. The mixture is allowed to react for four hours. The solvent is evaporated and the crude product is purified by column chromatography using a gradient of hexane/ethyl acetate to give the product.

PROCEDURE 9: Reaction of alcohol with carboxylic acid. Into a four necked flask is charged one mole equivalent of carboxylic acid solvated in toluene, to which is added one mole equivalent of alcohol, and a catalytic amount of sulfuric acid. The flask is fitted with a Dean Stark apparatus, mercury thermometer, mechanical stirrer, and the organic solution covered with nitrogen. The reaction mixture is raised to reflux (110° C.). Reflux is maintained for approximately four hours or until theoretical water is obtained in the Dean Stark trap. The condensate trap is emptied to remove the collected water, and allowed to refill with fresh distillate. An equal amount of virgin solvent is charged to the flask to maintain a consistent solvent level. Following another 30 minutes of reflux, the trap is again emptied and allowed to refill; again back charging fresh solvent to replace the distillate that is removed. This process is repeated four more times in an effort to drive maximum water removal from the system. Following the final 30 minutes of reflux, the oil bath is removed and the reaction shut down. The solvent is evaporated and the crude product is purified by column chromatography using a gradient of hexane/ethyl acetate to give the product.

PROCEDURE 10: Hydrosilation. A solution of one mole equivalent of alkene and toluene is prepared with stirring, to which is added a catalytic amount of hydrogen hexachloroplatinate (IV) hydrate ($H_2PtCl_6$, available from Aldrich). The resulting solution is heated to 80° C. and one mole equivalent of silicon hydride is added gradually via a syringe. The resulting mixture is heated for an additional hour at 80° C. After the reaction is allowed to cool to room temperature, the solvent is removed in vacuo to give the product.

PROCEDURE 11: Reaction of carboxylic acid with isocyanate. The synthetic procedure is conducted according to T. Nishikubo, E. Takehara, and A. Kameyama, *Polymer Journal*, 25, 421 (1993). A stirred mixture of one mole equivalent of isocyanate and one mole equivalent of carboxylic acid is solvated in toluene in a three-necked flask equipped with a mechanical stirrer and nitrogen inlet/outlet. The mixture is heated for two hours at 80° C. After the reaction is allowed to cool to room temperature, the solvent is removed in vacuo to give the product.

PROCEDURE 12: Reaction of disiloxane with vinyl epoxy. A round-bottomed flask is charged with one mole equivalent of disiloxane and one mole equivalent of vinyl epoxy resin. The reaction flask is equipped with a magnetic stirrer and a reflux condenser. To this mixture is added a catalytic amount of tris(triphenylphosphine)rhodium(I) chloride, and the reaction mixture is heated to 80–85° C. for six hours. The reaction is followed using gas chromatography by monitoring the disappearance of the starting materials and the appearance of the products. After the completion of the reaction, pure product is obtained by fractional vacuum distillation.

PROCEDURE 13: Synthesis of epoxy functional poly(butadiene). One mole equivalent of PBD is dissolved in toluene and placed in a two-necked round bottomed flask. One mole equivalent of epoxy siloxane adduct is added to the flask, and the reaction mixture is heated to 60° C. One drop of Karstedt's catalyst is added, and the hydrosilation reaction is obtained and monitored by following the disappearance of Si—H band at 2117 $cm^{-1}$ in the infrared spectrum. The reaction is completed in approximately two to three hours. After cooling, the reaction mixture is poured with stirring into methanol to precipitate the grafted PBD polymer. The precipitated PBD is washed with methanol and dried in vacuo at 60° C. for eight hours.

PROCEDURE 14: Reaction of alcohol with vinyl silane. One mole equivalent of alcohol and triethylamine are mixed in dry toluene at 0° C. One mole equivalent of vinyl silane dissolved in toluene is carefully added. The mixture is allowed to react for four hours at room temperature. The solvent is evaporated to give the product.

STARTING MATERIALS FOR EXAMPLES

The chemical structures, commercial source, or synthetic method for various of the precursors or starting materials used in the Examples are depicted here and identified with the designation SM.

SM-A: Resin prepared according to synthetic procedure 2 by the reaction of SM-G and SM-V.

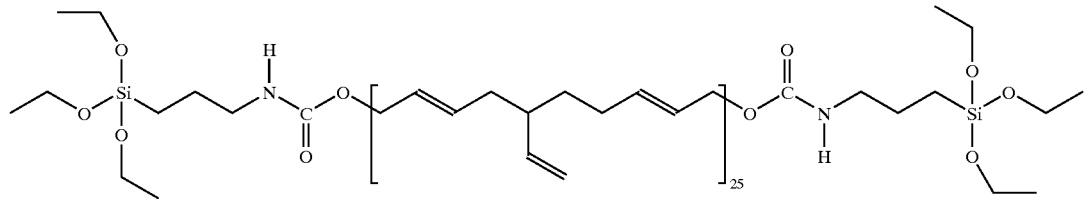

SM-B: Resin prepared according to synthetic procedure 2 by the reaction of PBD SM-H and SM-V.

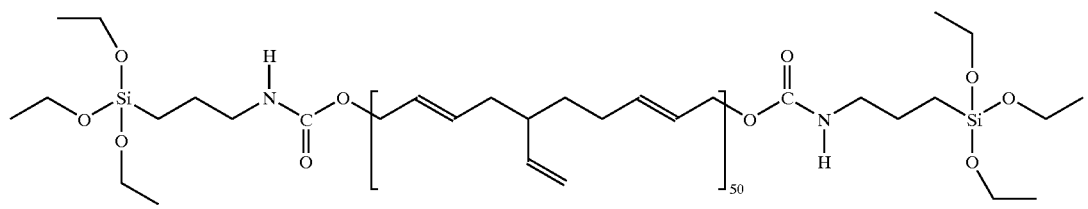

SM-C: Resin prepared according to synthetic procedure 2 by the reaction of SM-I and SM-V.

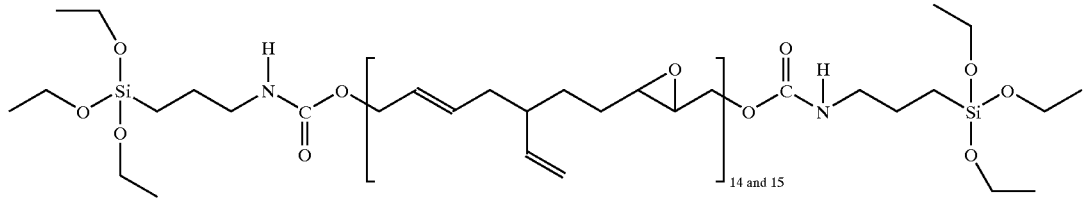

SM-D: Resin prepared according to synthetic procedure 2 by the reaction of PBD SM-19 and SM-V.

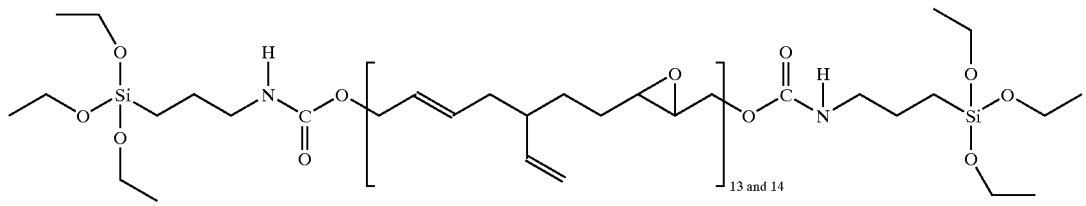

SM-E: Gamma-mercaptopropyltrimethoxysilane, commercially available from Witco Corp. as product Silquest A-189.

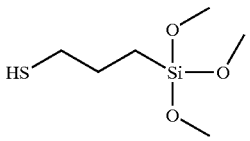

SM-F: Triethoxysilane, available from Wright Corporation.

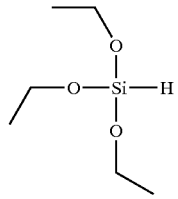

SM-G: PBD, commercially available from Elf Atochem as PolyBD R-20LM. According to the manufacturer's literature, the predominant microstructure is

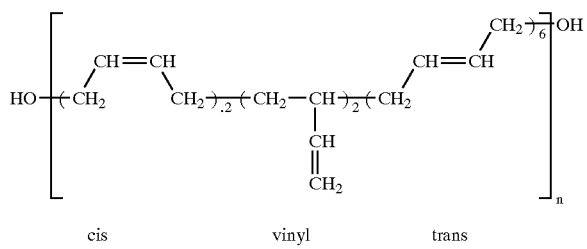

in which the cis unsaturation constitutes 20% of the unsaturation in the polymer chain, the trans unsaturation constitutes 20% of the unsaturation in the polymer chain, and the vinyl unsaturation constitutes 60% of the unsaturation in the polymer chain, and in which n is 25. This starting material will be represented throughout this specification and claims as:

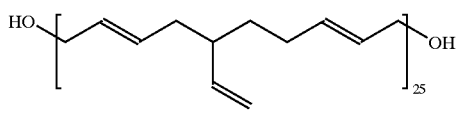

SM-H: PBD, commercially available from Elf Atochem as PolyBD R-45 HTLO. According to the manufacturer's literature, the predominant microstructure is the same as that disclosed for SM-G with the exception that n is 50. This starting material will be represented throughout this specification and claims as:

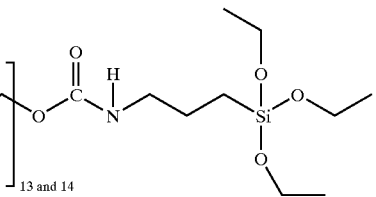

SM-I: Epoxidized PBD, commercially available from Elf Atochem as product Poly bd 600. According to the manufacturer's literature the predominant microstructure is

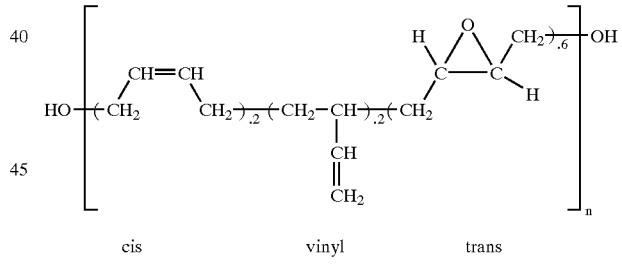

in which the cis unsaturation constitutes 20% of the unsaturation in the polymer chain, the trans unsaturation constitutes 20% of the unsaturation in the polymer chain, and the vinyl unsaturation constitutes 60% of the unsaturation in the polymer chain, and in which n is a mixture of 14 and 15 (some of the polymer chains will be the length in which n is 14, and the remainder of the polymer chains will be the length in which n is 15). This starting material will be represented throughout this specification and claims as:

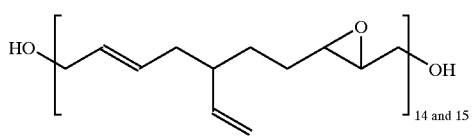

SM-J: Starting material prepared according to synthetic procedure 2 by the reaction of 4,4'-methylene di(phenylisocyanate) (MDI) with SM-G.

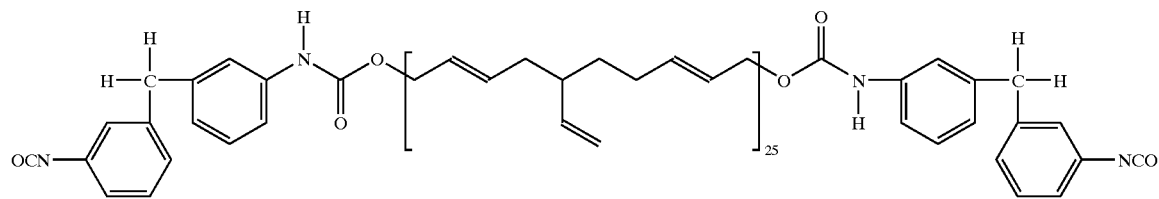

SM-K: Starting material prepared according to synthetic procedure 2 by the reaction of MDI with SM-H.

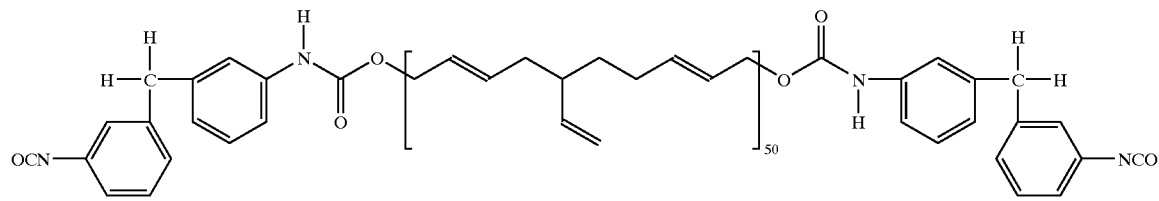

SM-L: Starting material prepared according to synthetic procedure 2 by the reaction of MDI with SM-I.

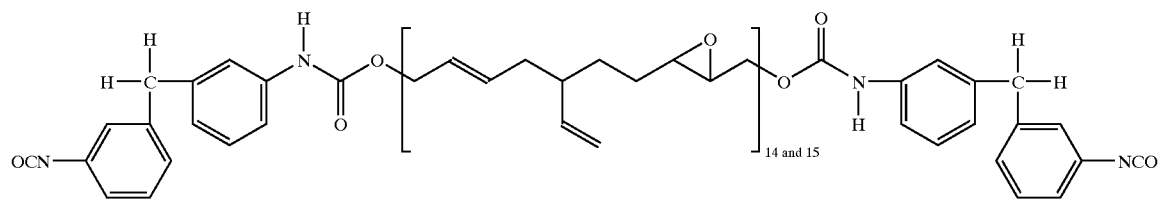

SM-M: Starting material prepared according to synthetic procedure 3 by the reaction of SM-E with SM-G.

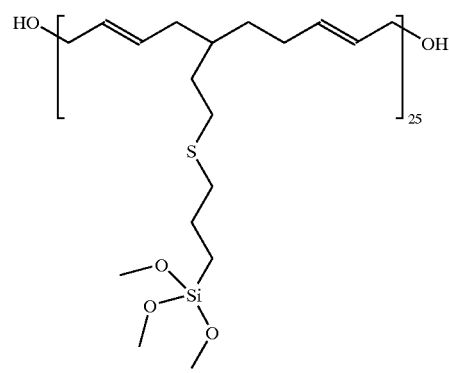

SM-N: Starting material prepared according to synthetic procedure 3 by the reaction of gamma-mercaptopropyl-trimethoxysilane SM-E with SM-H.

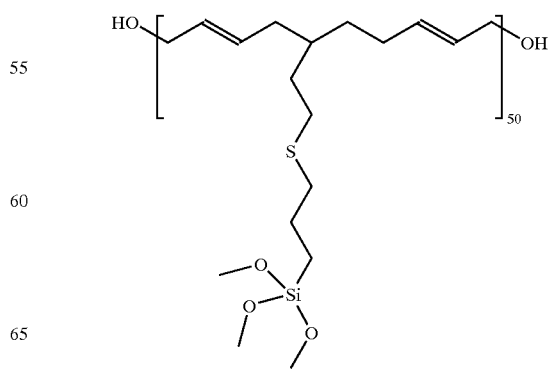

SM-O: Starting material prepared according to synthetic procedure 3 by the reaction of SM-E with SM-I.

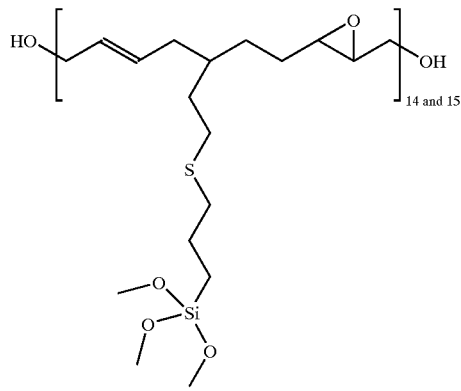

SM-P: Starting material prepared according to synthetic procedure 2 by the reaction of MDI with SM-M. This material is also an inventive example.

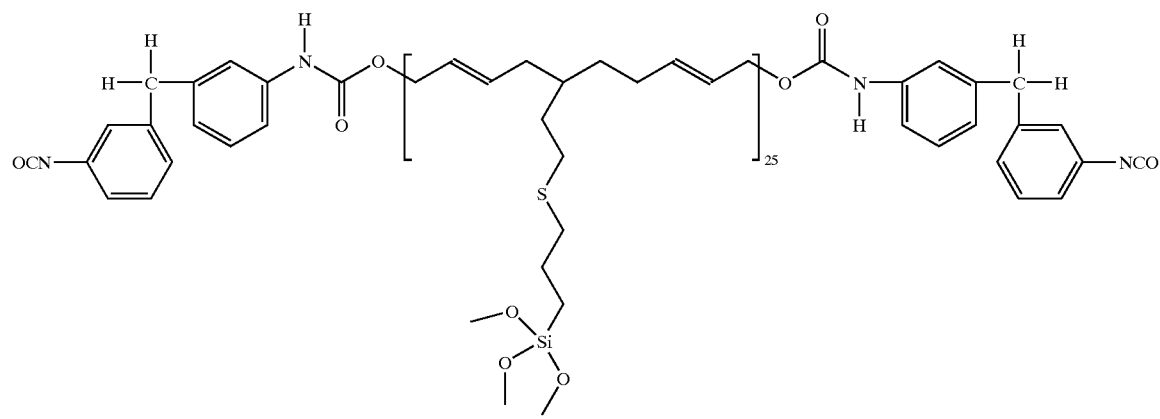

SM-Q: Starting material prepared according to synthetic procedure 2 by the reaction of MDI with SM-O. This material is also an inventive example.

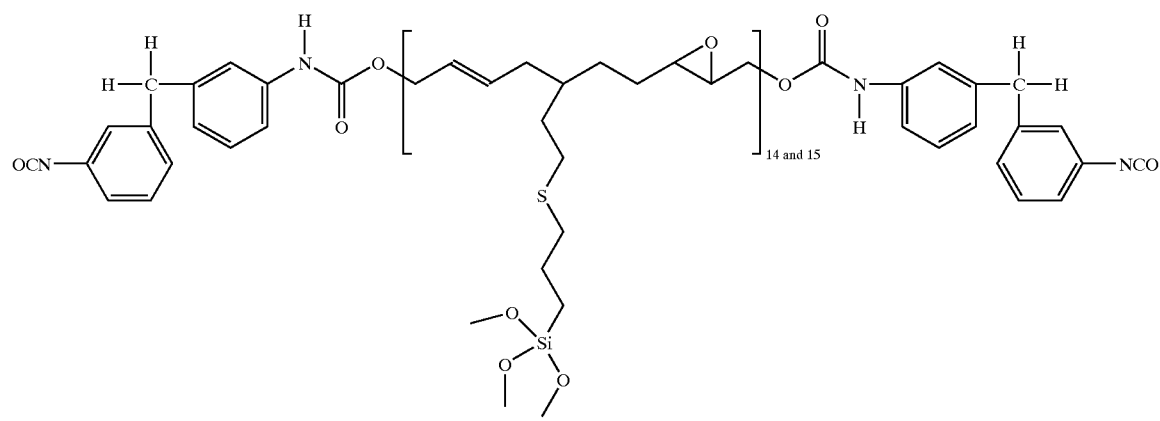

SM-R: Starting material prepared according to synthetic procedure 7 by the reaction of SM-H with methyl sulfonyl chloride and lithium chloride.

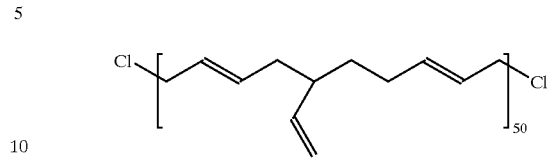

SM-S: Starting material prepared according to synthetic procedure 5 by the reaction of SM-R with $NH_3$.

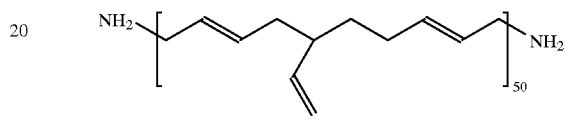

SM-T: 1,3-Divinyltetramethyldisilazane, available from Wright Corporation.

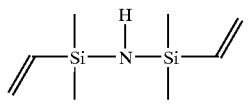

SM-U: Fumaric acid ethyl ester.

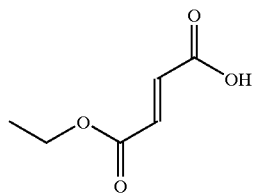

SM-V: Gamma-isocyanatopropyltriethoxysilane, commercially available from Witco Corp. as Silquest A-1310.

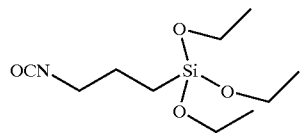

EXAMPLES 1–17

Examples 1 to 17 show adhesion promoting resins in which the unsaturated polymeric segment is terminated with an electron donor or electron acceptor functionality, and the silane segment is pendant from the polymeric segment.

Example 1

Resin containing electron donor functionality prepared according to synthetic procedure 2 by the reaction of SM-P with cinnamyl alcohol.

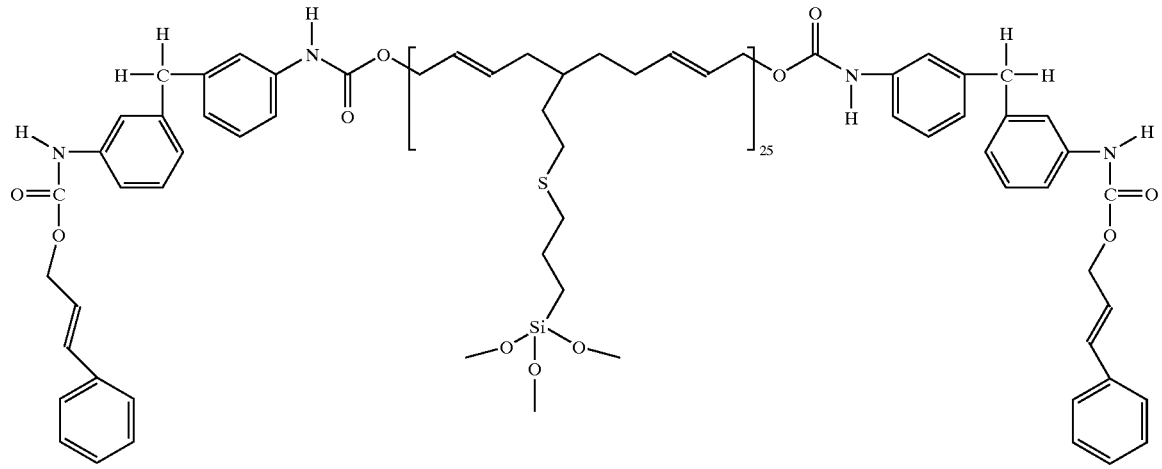

Example 2

Resin containing electron donor functionality prepared according to synthetic procedure 4 by the reaction of SM-Q and 3-isopropenyl-α,α-methylbenzyl amine.

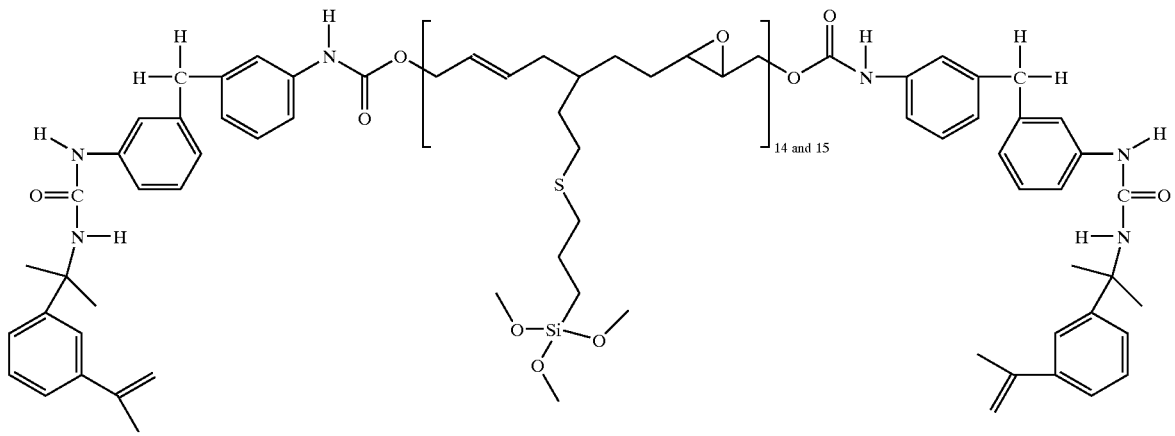

Example 3

Resin containing electron acceptor functionality prepared according to synthetic procedure 10 by the reaction of SM-L and SM-F, followed by synthetic procedure 2, reaction with hydroxyethyl maleimide.

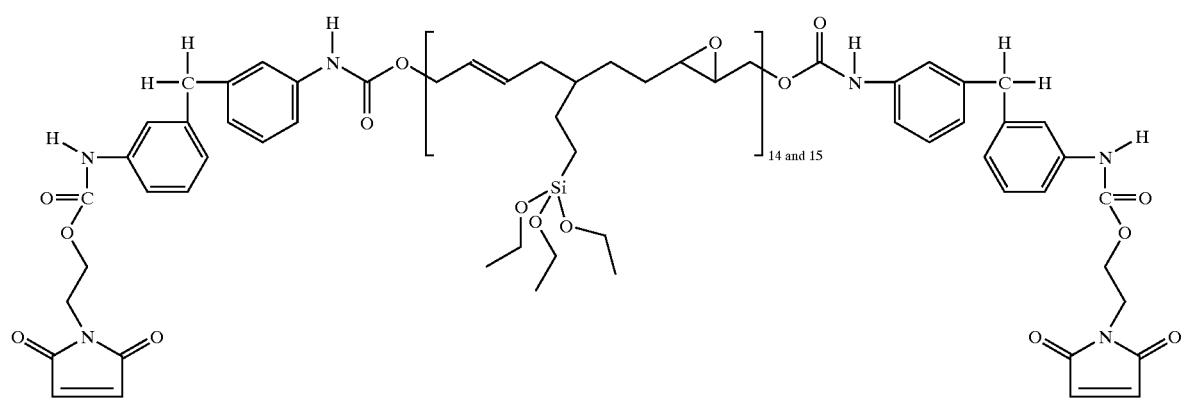

Example 4

Resin containing electron acceptor functionality prepared according to synthetic procedure 10 by the reaction of SM-K and SM-F, followed by synthetic procedure 2, reaction with hydroxyethyl acrylate.

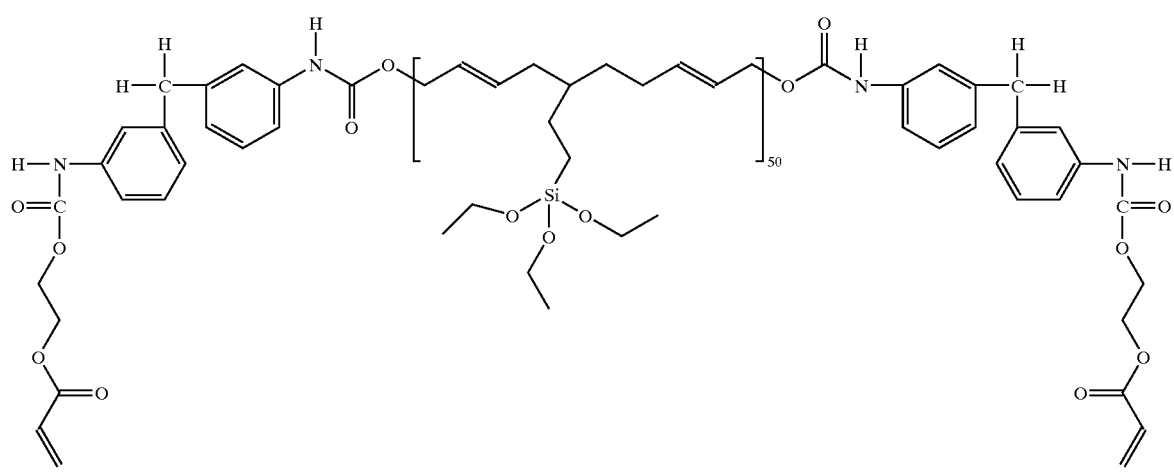

Example 5
Resin containing electron donor functionality prepared according to synthetic procedure 10 by the reaction of SM-J and SM-F, followed by synthetic procedure 2, reaction with propylamine vinyl ether.
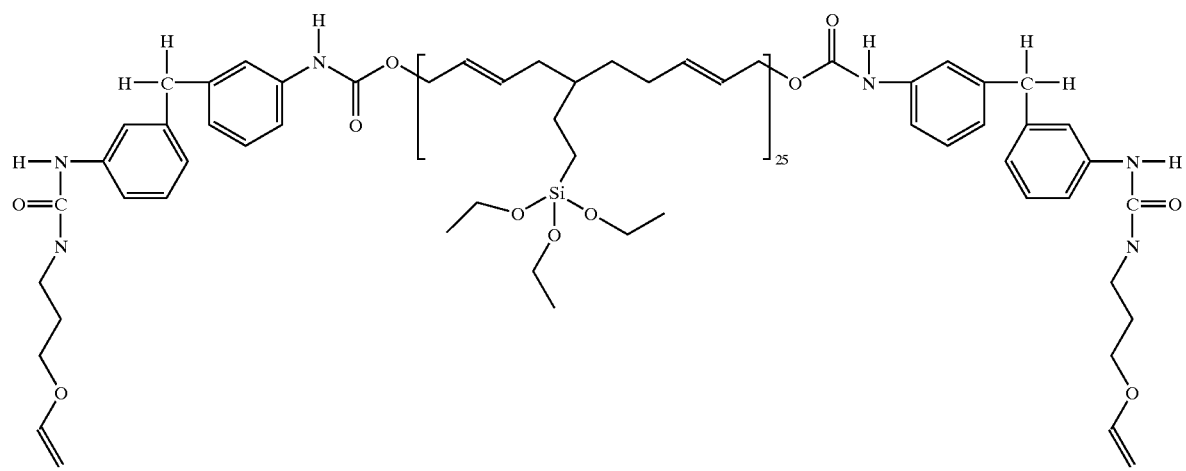
Example 6
Resin containing electron acceptor functionality prepared according to synthetic procedure 11 by the reaction of SM-P and fumaric acid SM-U.
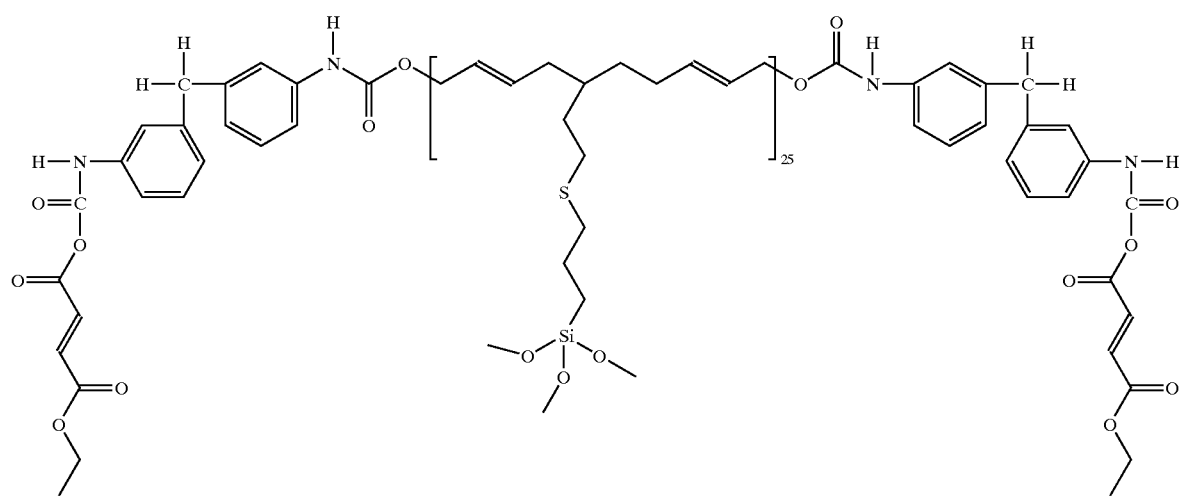

Example 7

Resin containing electron donor functionality prepared according to synthetic procedure 2 by the reaction of SM-M and 3-isopropenyl-α,α-methylbenzyl isocyanate.

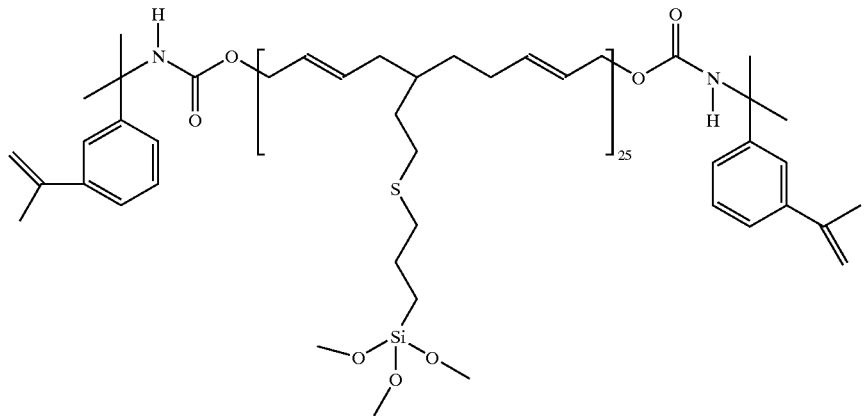

Example 8

Resin containing electron donor functionality prepared according to synthetic procedure 6 by the reaction of SM-G and cinnamyl chloride, followed by synthetic procedure 10, reaction with SM-F.

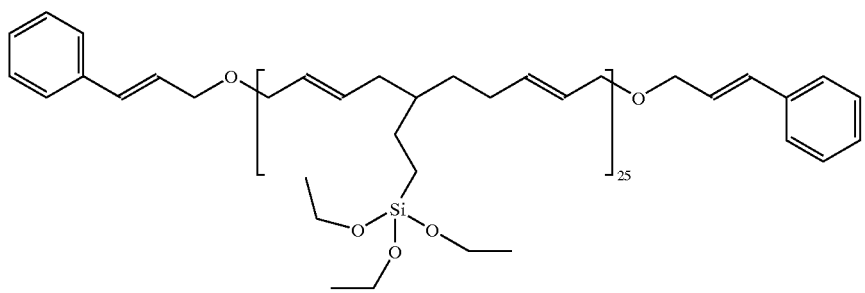

Example 9

Resin containing electron acceptor functionality prepared according to synthetic procedure 9 by the reaction of SM-M and SM-U.

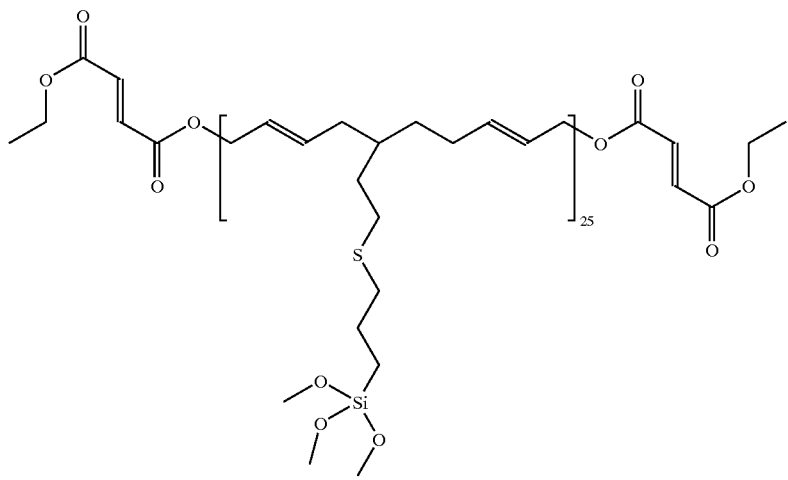

Example 10

Resin containing electron acceptor functionality prepared according to procedure 8 by the reaction of SM-M and 2-isobutanoylchloride.

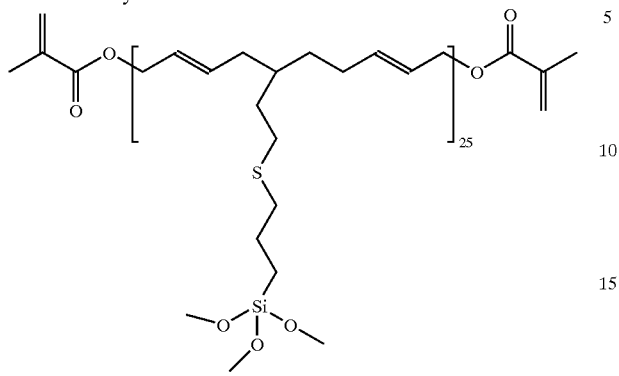

Example 11

Resin containing electron donor functionality prepared according to synthetic procedure 3 by the reaction of SM-S and SM-E, followed by synthetic procedure 4, reaction with 3-isopropenyl-α,α-methylbenzyl amine.

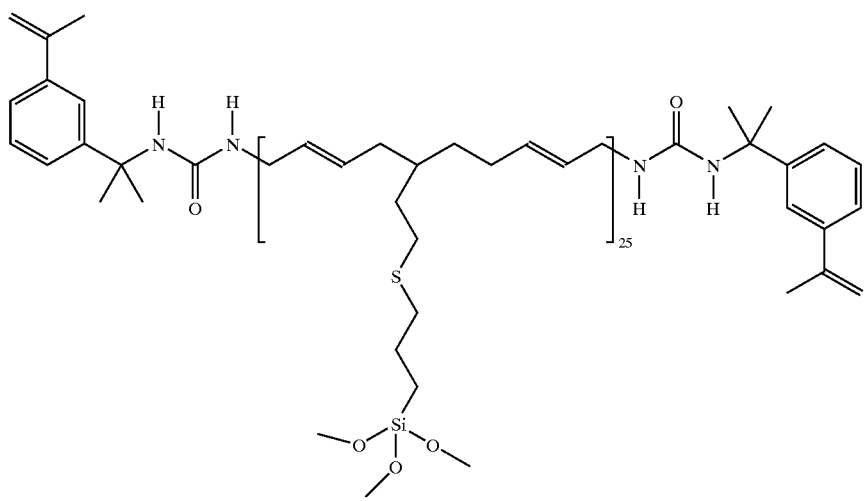

Example 12

Resin containing electron donor functionality prepared according to synthetic procedure 5 by the reaction of SM-S with cinnamyl chloride, followed by synthetic procedure 3, reaction with SM-E.

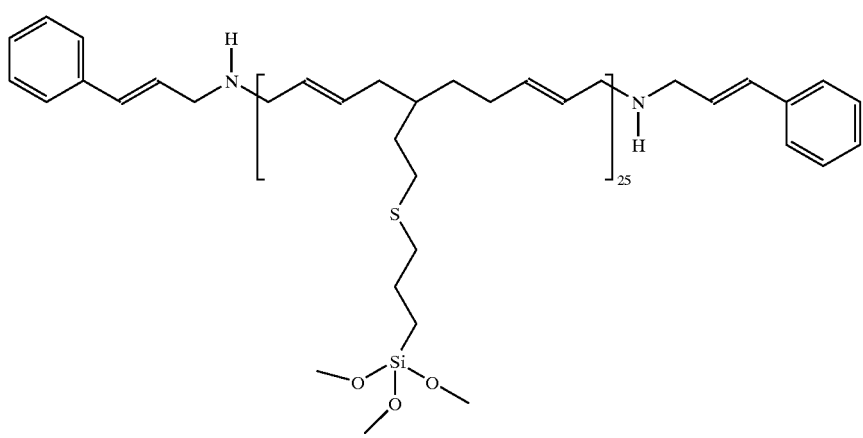

Example 13

Resin containing electron donor functionality prepared according to synthetic procedure 2 by the reaction of SM-H and 3-isopropenyl-α,α-methylbenzyl isocyanate, followed by synthetic procedure 10, reaction with SM-F.

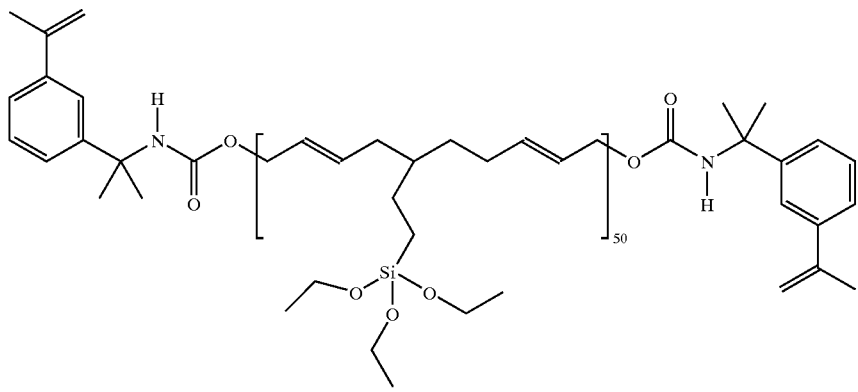

Example 14

Resin containing electron donor functionality prepared according to synthetic procedure 4 by the reaction of SM-S and 4-vinyl benzyl chloride, followed by synthetic procedure 10, reaction with SM-F.

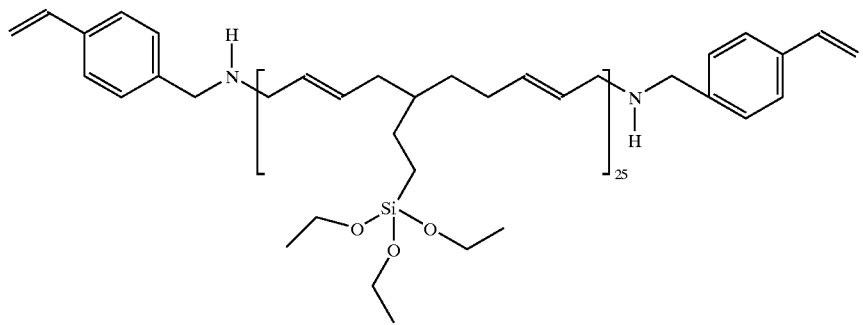

Example 15

Resin containing vinyl silane as electron donor functionality, prepared according to synthetic procedure 4 by the reaction of SM-T and SM-P.

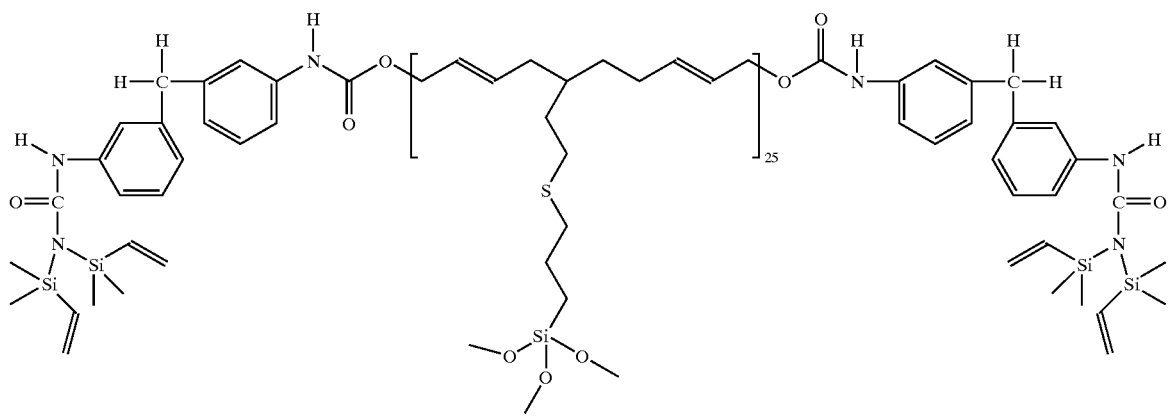

Example 16

Resin containing vinyl silane as electron donor functionality prepared according to synthetic procedure 14 by the reaction of SM-N with trivinylchlorosilane.

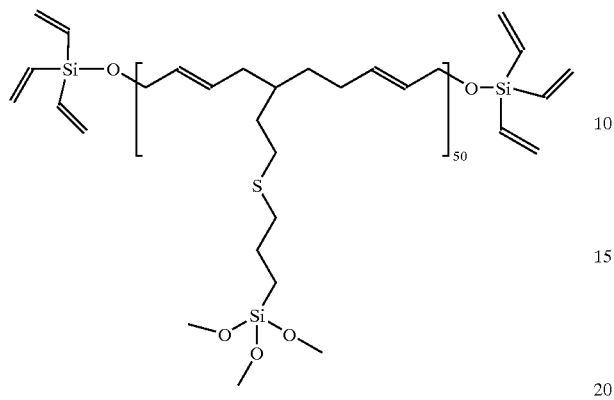

Example 17

Resin containing vinyl silane as electron donor functionality formed by the reaction of SM-M with methylphenyl vinylchlorosilane

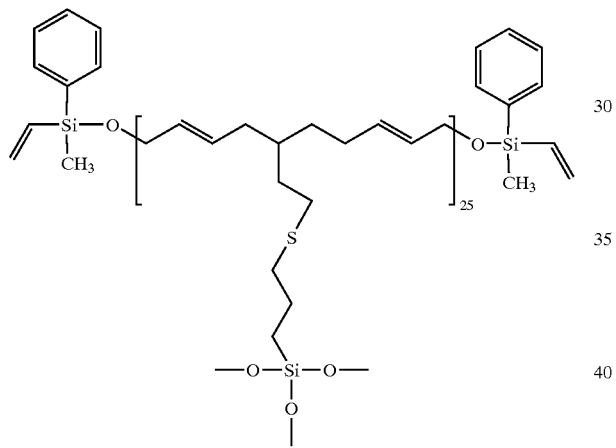

Examples 18 to 20

Examples 18 to 20 show adhesion promoting resins in which epoxy, electron acceptor, or electron donor functionality is pendant from the polymeric chain, and the silane segment is on the termini of the polymeric chain.

Example 18

Reaction of 3-vinyl-7-oxabicyclo [4.1.0]heptane (prepared according to synthetic procedure 12) with 1,1,3,3-tetramethyidisiloxane to give 1-[2-(3-[7-oxabicyclo[4.1.0]heptyl])ethyl]-1,1,3,3-tetramethyldisiloxane (prepared according to synthetic procedure 13), further reacted with SM-A according to synthetic procedure 10. Similar examples can be made using the resins of SM-B, SM-C and SM-D.

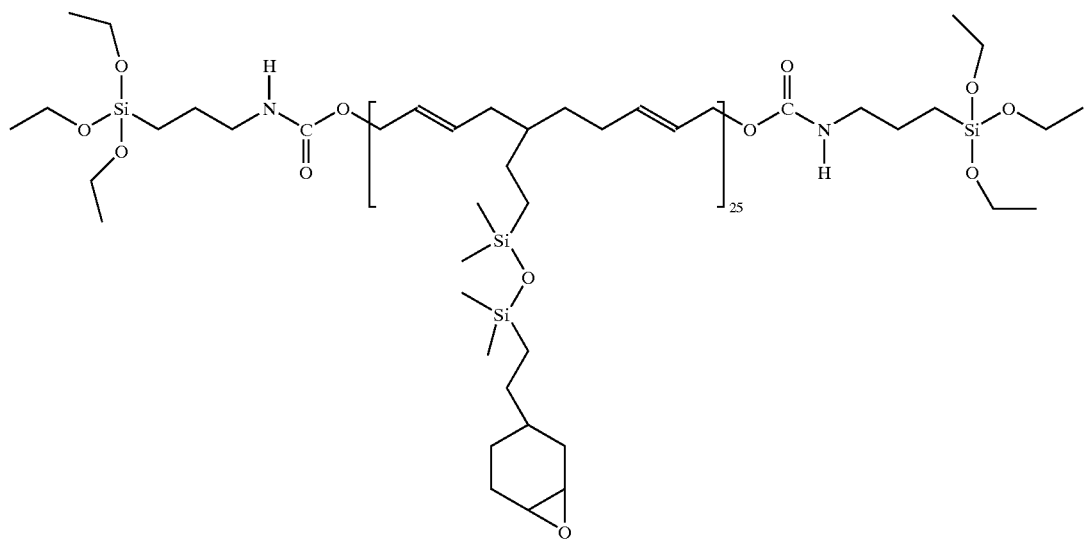

Example 19

Reaction of SM-A with mercaptoethanol according to procedure 1, followed by reaction with acryloyl chloride according to procedure 8.

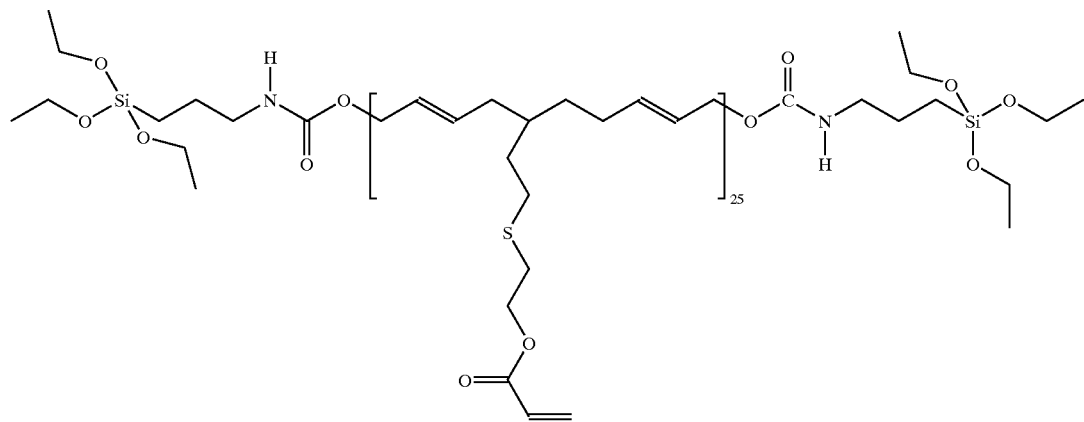

Example 20

Reaction of SM-A with mercaptoethanol according to procedure 1, followed by reaction with cinnamyl chloride according to procedure 6.

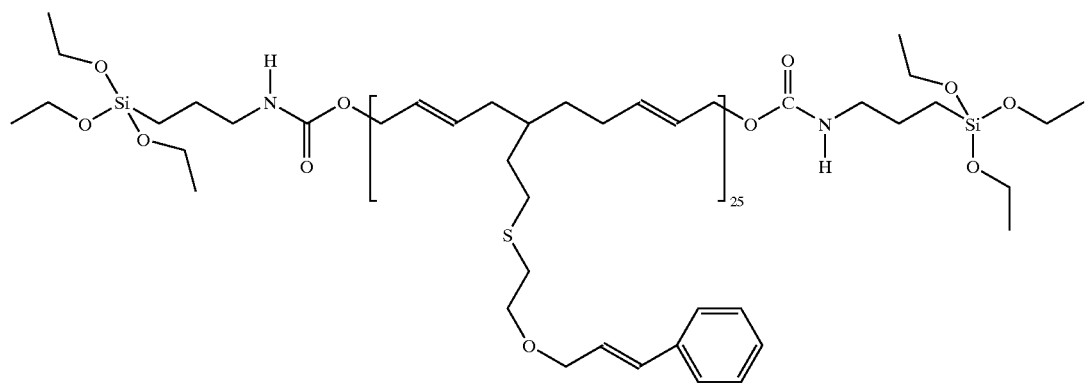

What is claimed is:

1. A curable compound having the structure

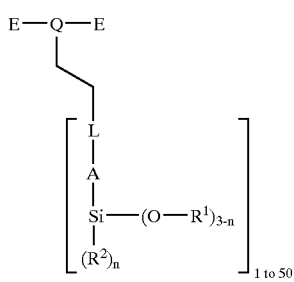

in which
(i) Q is an oligomeric or polymeric group containing at least one carbon to carbon double bond;
(ii) E is a cinnamyl, fumarate, maleate, maleimide, or vinyl ether group;
(iii) $R^1$ is a methyl or ethyl group;
(iii) $R^2$ is a vinyl group, an aromatic group, or a linear or branched alkyl group of 1 to 4 carbon atoms;
(v) A is a hydrocarbyl group;
(vi) L is a linking group resulting from the reaction of a functional group on the precursor for the segment containing silane and a functional group on the precursor for the segment containing the at least one carbon to carbon double bond; and
(vii) n is simultaneously for each position 0, 1, or 2.

2. The curable compound according to claim 1 in which Q is derived from a poly(butadiene) precursor.

3. The curable compound of claim 1, in combination with a curing agent and optionally a filler.

4. The curable compound of claim 1, in combination with a curing agent and optionally a filler, in which the combination is disposed and cured between a silicon chip and a substrate.

* * * * *